(12) United States Patent
Kim et al.

(10) Patent No.: US 11,839,134 B2
(45) Date of Patent: *Dec. 5, 2023

(54) DISPLAY DEVICE HAVING A DETECTION ELEMENT

(71) Applicant: Samsung Display Co., Ltd., Yongin-si (KR)

(72) Inventors: Suk Kim, Hwaseong-si (KR); Yu Na Kim, Seoul (KR); Soo Jung Lee, Suwon-si (KR); Keum Dong Jung, Seoul (KR); Go Eun Cha, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 45 days.

This patent is subject to a terminal disclaimer.

(21) Appl. No.: 17/532,466

(22) Filed: Nov. 22, 2021

(65) Prior Publication Data
US 2022/0085109 A1 Mar. 17, 2022

Related U.S. Application Data

(63) Continuation of application No. 16/849,777, filed on Apr. 15, 2020, now Pat. No. 11,183,539.

(30) Foreign Application Priority Data

Aug. 9, 2019 (KR) .................. 10-2019-0097493

(51) Int. Cl.
H01L 29/08 (2006.01)
H10K 65/00 (2023.01)
(Continued)

(52) U.S. Cl.
CPC ......... *H10K 65/00* (2023.02); *G06V 40/1318* (2022.01); *H10K 30/353* (2023.02);
(Continued)

(58) Field of Classification Search
CPC ...... H10K 65/00; H10K 59/122; H10K 50/16; H10K 50/15; H10K 39/32; H10K 30/353
(Continued)

(56) References Cited

U.S. PATENT DOCUMENTS

2002/0104995 A1* 8/2002 Yamazaki ............ H10K 59/122
257/E27.113
2017/0279084 A1* 9/2017 Sakamoto .......... H10K 59/1213
(Continued)

*Primary Examiner* — Phuc T Dang
(74) *Attorney, Agent, or Firm* — Lewis Roca Rothgerber Christie LLP

(57) ABSTRACT

A display device is provided. The display device includes a first substrate, a first detection electrode on the first substrate, a first bank including an opening that exposes the first detection electrode, a photosensitive layer on the first detection electrode, a second detection electrode on the photosensitive layer, a first electrode on the second detection electrode, a second bank including an opening that exposes the first electrode, a light emitting layer on the first electrode, a second electrode on the light emitting layer, a first optical system between the second detection electrode and the first electrode, and a second optical system on the second electrode, wherein the first optical system and the second optical system overlap the photosensitive layer in a thickness direction of the display device.

20 Claims, 11 Drawing Sheets

(51) Int. Cl.
  *G06V 40/13*    (2022.01)
  *H10K 30/30*    (2023.01)
  *H10K 39/32*    (2023.01)
  *H10K 50/15*    (2023.01)
  *H10K 50/16*    (2023.01)
  *H10K 59/122*   (2023.01)

(52) U.S. Cl.
  CPC ............ *H10K 39/32* (2023.02); *H10K 50/15* (2023.02); *H10K 50/16* (2023.02); *H10K 59/122* (2023.02)

(58) Field of Classification Search
  USPC .......................................................... 257/40
  See application file for complete search history.

(56) References Cited

U.S. PATENT DOCUMENTS

| | | |
|---|---|---|
| 2017/0365813 A1 | 12/2017 | Kamiya |
| 2018/0011385 A1 | 1/2018 | Kang et al. |
| 2018/0088708 A1 | 3/2018 | Naganuma et al. |
| 2019/0013368 A1 | 1/2019 | Chung et al. |
| 2019/0189717 A1* | 6/2019 | Choi .................... H10K 50/865 |
| 2021/0151524 A1* | 5/2021 | Tang .................. G06V 40/1318 |

* cited by examiner

DISPLAY DEVICE HAVING A DETECTION ELEMENT

CROSS-REFERENCE TO RELATED APPLICATIONS

This application is a continuation of U.S. patent application Ser. No. 16/849,777, filed Apr. 15, 2020, now U.S. Pat. No. 11,183,539, which claims priority to and the benefit of Korean Patent Application No. 10-2019-0097493, filed Aug. 9, 2019, the entire content of both of which is incorporated herein by reference.

BACKGROUND

1. Field

Embodiments of the present disclosure relate to a display device.

2. Description of the Related Art

The importance of display devices is increasing with the development of multimedia. Accordingly, various display devices such as a liquid crystal display device (LCD), an organic light emitting display device (OLED), and the like are used. Organic light emitting display devices have an excellent viewing angle as a self-emissive element and, thus, are attracting attention as a next-generation display device.

A detection element capable of recognizing biometric information, such as a fingerprint or the like of a user, may be embedded in a display panel of the organic light emitting display device.

SUMMARY

Embodiments of the present disclosure are directed to providing a display device capable of biometric recognition and of preventing or reducing degradation of display quality.

Further, embodiments of the present disclosure are directed to providing a display device capable of improving a signal to noise ratio (SNR) of a detection element.

Features provided by the present disclosure are not limited to the above-described features, and other technical features, which are not mentioned herein, may be understood by those of ordinary skill in the art from the specification and from the accompanying drawings.

According to some exemplary embodiments of the disclosure, a display device includes a first substrate, a first detection electrode on the first substrate, a first bank including an opening that exposes the first detection electrode, a photosensitive layer on the first detection electrode, a second detection electrode on the photosensitive layer, a first electrode on the second detection electrode, a second bank including an opening that exposes the first electrode, a light emitting layer on the first electrode, a second electrode on the light emitting layer, a first optical system between the second detection electrode and the first electrode, and a second optical system on the second electrode, wherein the first optical system and the second optical system overlap the photosensitive layer in a thickness direction of the display device.

In some exemplary embodiments, the first optical system includes a first optical layer including a plurality of through holes and a first filling layer that fills the through holes of the first optical layer.

In some exemplary embodiments, the first optical layer includes a metallic material; and the first filling layer includes a transparent organic material.

In some exemplary embodiments, the second optical system includes a second optical layer including a plurality of through holes and a second filling layer that fills the through holes of the second optical layer.

In some exemplary embodiments, the second optical layer includes the same material as the first optical layer; and the second filling layer includes the same material as the first filling layer.

In some exemplary embodiments, the second optical system does not overlap the first electrode in the thickness direction of the display device.

In some exemplary embodiments, a width of the first optical system in a first direction is greater than a width of the first detection electrode in the first direction.

In some exemplary embodiments, the first optical system at least partially overlaps the first electrode.

In some exemplary embodiments, the display device further includes a first thin film encapsulation film between the second detection electrode and the first optical system, and the first optical system comes into contact with the first thin film encapsulation film.

In some exemplary embodiments, the display device further includes a second thin film encapsulation film between the second electrode and the second optical system, and the second optical system comes into contact with the second thin film encapsulation film.

In some exemplary embodiments, the second detection electrode includes a hole area which passes through the second detection electrode in the thickness direction of the display device; and the hole area exposes the first bank.

In some exemplary embodiments, the hole area at least partially overlaps the first electrode.

In some exemplary embodiments, the display device further includes a first source electrode and a first drain electrode on the first substrate, and the first electrode is electrically connected to the first source electrode or the first drain electrode through a contact hole passing through the first bank.

In some exemplary embodiments, the contact hole is in the hole area.

In some exemplary embodiments, the display device further includes a connection electrode configured to connect the first source electrode or the first drain electrode and the first electrode, and the connection electrode is on a same layer as the first detection electrode.

In some exemplary embodiments, the display device further includes a second source electrode and a second drain electrode on a same layer as the first source electrode, and the second detection electrode is electrically connected to the second source electrode or the second drain electrode.

In some exemplary embodiments, the display device further includes an electron blocking layer between the first detection electrode and the photosensitive layer.

In some exemplary embodiments, the light emitting layer includes a hole transporting layer, an electron transporting layer, and a light emitting material layer between the hole transporting layer and the electron transporting layer, and the photosensitive layer includes an organic photosensitive material.

In some exemplary embodiments, the opening of the first bank defines a light receiving area of the photosensitive layer, and the opening of the second bank defines a light emitting area of the light emitting layer.

In some exemplary embodiments, the light receiving area and the light emitting area are alternately arranged in a plan view.

BRIEF DESCRIPTION OF THE DRAWINGS

The above and other aspects and features of the present disclosure will become more apparent by describing exemplary embodiments thereof with reference to the attached drawings, in which.

DETAILED DESCRIPTION

The present disclosure will now be described more fully hereinafter with reference to the accompanying drawings, in which some embodiments of the disclosure are shown. However, the embodiments of the present disclosure are not limited to the embodiments shown and described herein, and the subject matter of the present disclosure may be embodied in different forms. Rather, embodiments shown and described herein are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The singular forms used herein, unless the context clearly indicates otherwise, may include the plural forms.

The same reference numbers indicate the same components throughout the specification.

Hereinafter, embodiments of the present disclosure will be described with reference to the accompanying drawings.

In the specification, a first direction DR1 refers to an X axis direction, a second direction DR2 refers to a Y axis direction, and a third direction DR3 refers to a Z axis direction.

Figure 1:
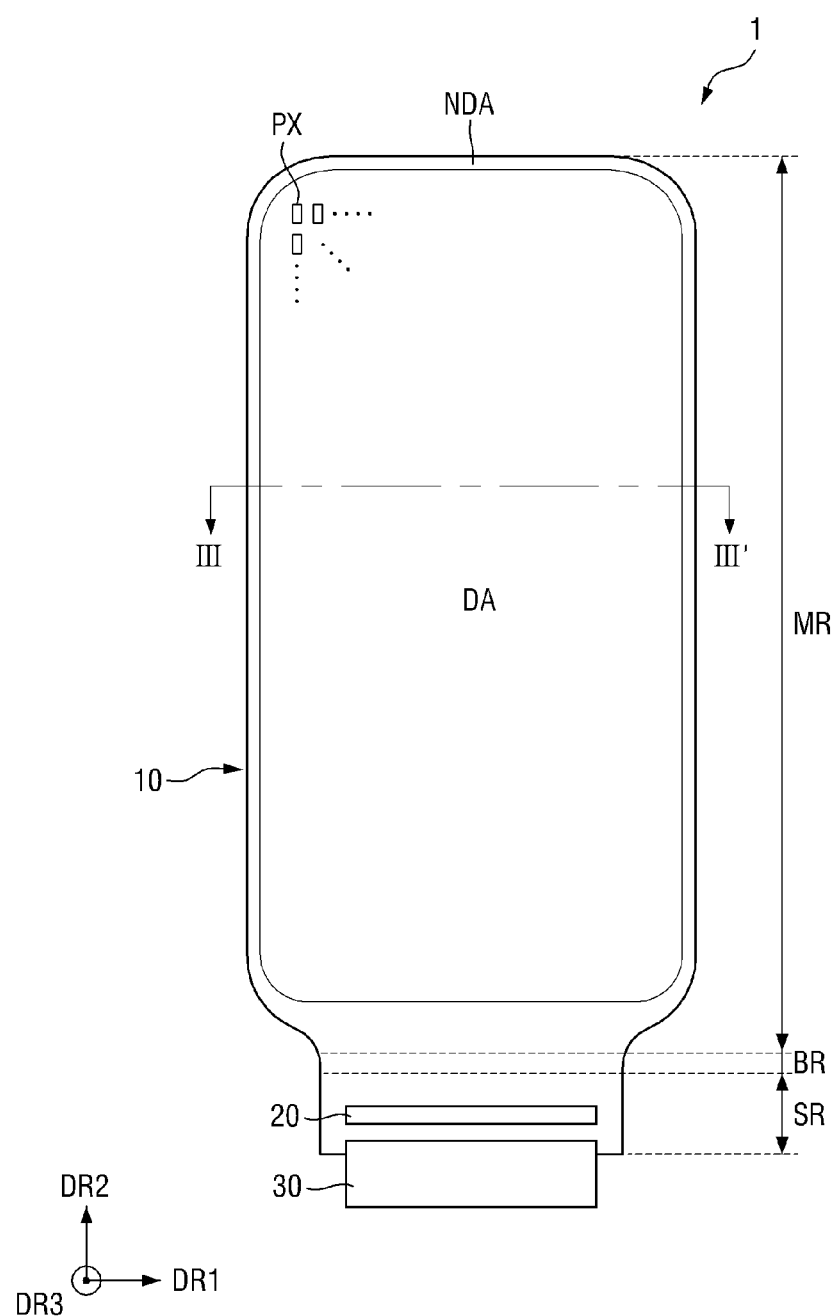
FIG. 1 is a plan view of a display device according to an embodiment.
Figure 2:
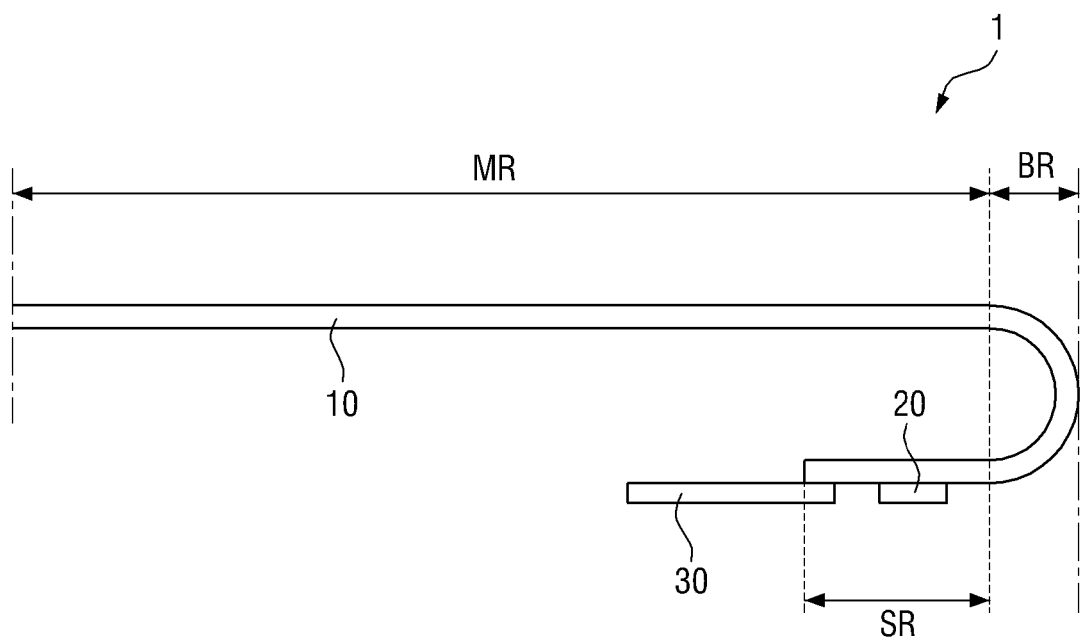
FIG. 2 is a side view of the display device in FIG. 1, according to an embodiment.
Figure 2:
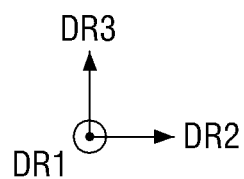

FIG. 1 is a plan view of a display device according to an embodiment, and FIG. 2 is a side view of the display device in FIG. 1, according to an embodiment.

Referring to FIGS. 1 and 2, a display device 1 is a device configured to display a video or a still image, and the display device 1 may be used as a display screen for portable electronic devices such as, for example, a mobile phone, a smart phone, a tablet PC, a smart watch, a watch phone, a mobile communication terminal, an electronic notebook, an electronic book, a portable multimedia player (PMP), a navigation device, an ultra-mobile personal computer (UMPC), and the like, but embodiments are not limited thereto. The display device 1 may be used as a display screen for any suitable product, such as, for example, a television, a notebook, a monitor, a billboard, internet of things, and/or the like.

The display device 1 may include a display panel 10. The display panel 10 may be a flexible board including a flexible polymer material such as, for example, polyimide and/or the like. Accordingly, the display panel 10 may be curved, bent, folded, and/or rolled.

The display panel 10 may include a display area DA, which is a portion configured to display an image, and a non-display area NDA which is a portion of the display panel 10 other than the display area DA. The display area DA may include a plurality of pixels PX.

The display panel 10 may include a main region MR and a bending region BR connected to one side of the main region MR. The display panel 10 may further include a sub region SR connected to the bending region BR (e.g., connected to one side of the bending region BR) and overlapping the main region MR in a thickness direction. As used herein, "thickness direction" may refer to a thickness direction of the display device.

The main region MR may include the display area DA. A peripheral edge portion of the display area DA of the main region MR may be the non-display area NDA.

The main region MR may have a shape similar to an appearance of (e.g., similar to a shape of) the display device 1 in a plan view. The main region MR may be a flat region at one side of the display device 1. However, the present disclosure is not limited thereto, and the main region MR may include at least one edge other than an edge (e.g., a side) connected to the bending region BR that may be curved to form (e.g., to provide) a curved surface or that may be bent in a vertical direction.

When the main region MR includes at least one edge other than the edge (e.g., the side) connected to the bending region BR that forms a curved surface or that is bent, the display area DA may also be at the corresponding edge. However, the present disclosure is not limited thereto. In some embodiments, the non-display area NDA may be at the curved surface or at the bent edge. In some embodiments, both the display area DA and the non-display area NDA may be at the curved surface or at the bent edge.

The non-display area NDA of the main region MR may be an area from an outer boundary of the display area DA to the edge of the display panel 10. A signal line, a connection line, and/or driving circuits configured to apply signals to the display area DA, may be in the non-display area NDA of the main region MR. Further, a black matrix (e.g., an outermost black matrix) may be in the non-display area NDA of the main region MR, but embodiments are not limited thereto.

The bending region BR is connected to the main region MR. In some embodiments, the bending region BR may be connected to the main region MR at one short side of the main region MR. The display panel 10 may be bent at the bending region BR with a curvature in a direction opposite to a third direction DR3 (e.g., in a direction opposite to a display surface). For example, the display panel 10 may be bent at the bending region BR toward a lower surface of the display device 1. Because the display panel 10 is bent at the bending region BR, a surface (e.g., a portion of a surface) of the display panel 10 may be reversed. In some embodiments, one surface of the display panel 10 (e.g., a portion of the surface of the display panel 10) facing upward may be changed (e.g., may be bent) to face an outer side and then to face downward through the bending region BR.

The sub region SR extends from the bending region BR. The sub region SR may extend in a direction (e.g., may extend along a plane that is) parallel (e.g., substantially parallel) to the main region MR after bending is completed. The sub region SR may overlap the main region MR of the display panel 10 in the third direction DR3 (e.g., in a thickness direction). The sub region SR may overlap the non-display area NDA of the edge of the main region MR, and may also overlap the display area DA of the main region MR.

A driving chip 20 (or a driving chip and a pad part electrically connected to the driving chip) may be on the sub region SR of the display panel 10. The driving chip 20 may generate driving signals to drive the pixels PX and may provide (e.g., may output or send) the driving signals to the pixels PX in the display area DA. In some embodiments, the driving chip 20 may generate data signals to determine the luminous intensity of the pixels PX. In some embodiments, the driving chip 20 may provide (e.g., may output or send) the data signals to the pixels PX through the connection line and the signal line.

The driving chip 20 may be attached to the display panel 10 through (e.g., by) an anisotropic conductive film, or may be attached to the display panel 10 through (e.g., by) ultrasonic bonding. A width of the driving chip 20 in the second direction DR2 may be smaller than a width of the display panel 10 in the second direction DR2. In some embodiments, the width of the driving chip 20 in the second direction DR2 may be smaller than a width of the sub region SR in the second direction DR2.

A driving board 30 may be connected to an end portion of the sub region SR of the display panel 10. A pad part is provided on the end portion of the sub region SR, and the driving board 30 may be connected to the pad part. The driving board 30 may be a flexible printed circuit board or a flexible film.

Figure 3:
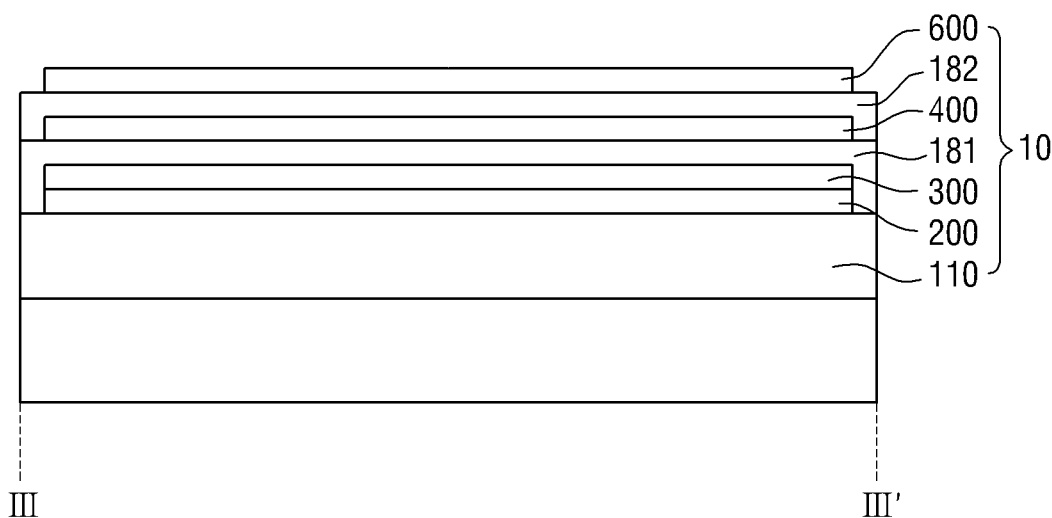
FIG. 3 is a cross-sectional view taken along line III-III' in FIG. 1, according to an embodiment.
Figure 3:
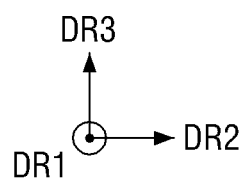

FIG. 3 is a cross-sectional view taken along line III-III' in FIG. 1, according to an embodiment.

Referring to FIG. 3, the display device 1 may include a substrate 110, a thin film transistor layer 200, a detection element layer 300, a light emitting element layer 400, thin film encapsulation films 181 and 182, and a sensing layer 600.

The substrate 110 may be a flexible substrate which may be curved, bent, folded, and/or rolled. When the substrate 110 is a flexible substrate, it may include, for example, Polyethersulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or any combination thereof.

The thin film transistor layer 200 may be on the substrate 110. The thin film transistor layer 200 may include thin film transistors of each of the pixels, scan lines, data lines, power lines, scan control lines, and link lines configured to connect pads and the data lines (e.g., configured to connect pads to the data lines). Each of the thin film transistors may include a gate electrode, a semiconductor layer, a source electrode, and a drain electrode.

The thin film transistor layer 200 may be in the display area DA and in the non-display area NDA. In some embodiments, the thin film transistors of each of the pixels, the scan lines, the data lines, and the power lines of the thin film transistor layer 200 may be in the display area DA. In some embodiments, the scan control lines and the link lines of the thin film transistor layer 200 may be in the non-display area NDA.

The detection element layer 300 may be on the thin film transistor layer 200. The detection element layer 300 may include detection elements including a first detection electrode, a photosensitive layer, and a second detection electrode. Light reflected or scattered from a fingerprint of a user is received by the detection element to be detected, and fingerprint recognition may be performed by a transistor (e.g., by utilizing the transistor) for a detection element. The detection element layer 300 will be described in more detail herein below with reference to FIG. 5.

A first thin film encapsulation film 181 may be on the detection element layer 300. The first thin film encapsulation film 181 may prevent or reduce the permeation or penetration of oxygen and/or moisture into the detection element layer 300. To this end, the first thin film encapsulation film 181 may include at least one inorganic film. The inorganic film may include a silicon nitride layer, a silicon oxynitride layer, a silicon oxide layer, a titanium oxide layer, and/or an aluminum oxide layer, but embodiments are not limited thereto. Further, the first thin film encapsulation film 181 may protect the light emitting element layer 400 from foreign matter such as, for example, dirt and/or dust. To this end, the first thin film encapsulation film 181 may include at least one organic film. The organic film may include an acryl resin, an epoxy resin, a phenolic resin, a polyamide resin, a polyimide resin, and/or the like, but embodiments are not limited thereto. The first thin film encapsulation film 181 may be in both the display area DA and the non-display area NDA. In some embodiments, the thin film encapsulation films 181 and 182 may cover the detection element layer 300 in the display area DA and in the non-display area NDA, and may cover the thin film transistor layer 200 in the non-display area NDA.

The light emitting element layer 400 may be on the first thin film encapsulation film 181. The light emitting element layer 400 may include pixels, and each pixel may include a first electrode, a light emitting layer, a second electrode and banks that define the pixel. The light emitting layer may include an organic light emitting layer including organic materials. In some embodiments, the light emitting layer may include a hole transporting layer, an organic light emitting layer, and an electron transporting layer. When a predetermined or set voltage is applied to the first electrode of a pixel through the thin film transistors of the thin film transistor layer 200, and a cathode voltage is applied to the second electrode of the pixel, holes and electrons move to the organic light emitting layer through the hole transporting layer and the electron transporting layer, respectively, and combine in the organic light emitting layer to emit light. The pixels of the light emitting element layer 400 may be in the display area DA. A cross-sectional structure of each of the pixels is described herein below with reference to FIG. 5.

A second thin film encapsulation film 182 may be on the light emitting element layer 400. The second thin film encapsulation film 182 may prevent or reduce permeation or penetration of oxygen and/or moisture into the light emitting element layer 400. The second thin film encapsulation film 182 may also protect the light emitting element layer 400 from foreign matter such as, for example, dirt and/or dust. The second thin film encapsulation film 182 may include the same materials as the first thin film encapsulation film 181, or may include one or more materials selected from the group of materials that may be included in the first thin film encapsulation film 181, as described above.

The second thin film encapsulation film 182 may be in both the display area DA and the non-display area NDA. In some embodiments, the second thin film encapsulation film 182 may cover the light emitting element layer 400 in the display area DA and in the non-display area NDA.

The sensing layer 600 may be on (e.g., directly on) the second thin film encapsulation film 182. In some embodiments, because the sensing layer 600 may be directly on the second thin film encapsulation film 182, a thickness of the display device 1 may be reduced compared to when a separate sensing panel including the sensing layer 600 is on (e.g., is attached to) the second thin film encapsulation film 182.

The sensing layer 600 may include a plurality of sensing electrodes configured to sense a touch of the user in a capacitance manner and may include a routing line (e.g., a plurality of routing lines) configured to connect the pads and the sensing electrodes (e.g., configured to connect the pads to the sensing electrodes). In some embodiments, the sensing layer 600 may sense the touch of the user in a self-capacitance manner or in a mutual capacitance manner.

A cover window 700 may also be on the sensing layer 600. The sensing layer 600 and the cover window 700 may be attached to each other by a transparent adhesion member. The cover window 700 will be described in more detail herein below.

Figure 4:
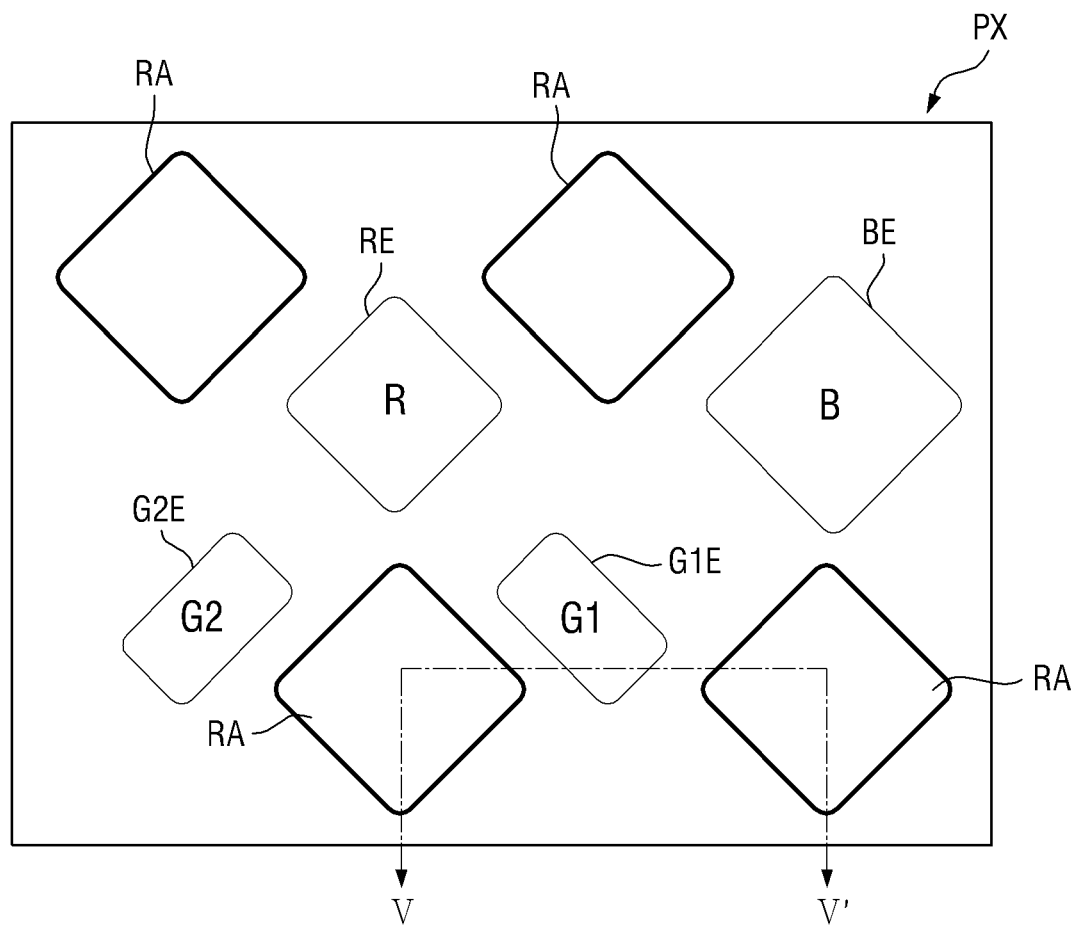
FIG. 4 is a plan view of a pixel in FIG. 1, according to an embodiment.
Figure 4:
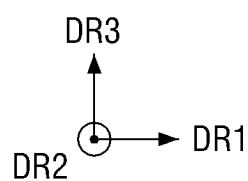

FIG. 4 is a plan view of a pixel in FIG. 1, according to an embodiment.

Referring to FIG. 4, the pixel PX may include a plurality of sub pixels R, G1, G2, and B, and the detection elements may be between the plurality of sub pixels R, G1, G2, and B. In some embodiments, light receiving areas RA of the detection elements may be between light emitting areas RE, G1E, G2E, and BE of the plurality of sub pixels R, G1, G2, and B.

The sub pixels R, G1, G2, and B may include a first sub pixel R that emits a first color, second sub pixels G1 and G2 that emit a second color, and a third sub pixel B that emits a third color. The second sub pixels G1 and G2 may include a second-A sub pixel G1 and a second-B sub pixel G2. A pixel PX may include (e.g., may be defined as) one first sub pixel R, one second-A sub pixel G1, one second-B sub pixel G2, and one third sub pixel B.

The light emitting areas RE, G1E, G2E, and BE of the sub pixels R, G1, G2, and B may be defined by a second bank 172, which is described in more detail below. The light emitting areas RE, G1E, G2E, and BE of the sub pixels R, G1, G2, and B may be areas which emit light by light emitting elements. The light emitting areas RE, G1E, G2E, and BE may include a first light emitting area RE corresponding to the first sub pixel R, a second-A light emitting area G1E corresponding to the second-A sub pixel G1, a second-B light emitting area G2E corresponding to the second-B sub pixel G2, and a third light emitting area BE corresponding to the third sub pixel B, respectively.

The first light emitting area RE and the third light emitting area BE may be alternately arranged in a first column along the first direction DR1. The second-A light emitting area G1E and the second-B light emitting area G2E may be alternately arranged in a second column along the first direction DR1.

The light emitting areas RE, G1E, G2E, and BE of the sub pixels R, G1, G2, and B may have different shapes and sizes. Although FIG. 4 illustrates an embodiment where the third light emitting area BE has the greatest area, and each of the second light emitting areas G1E and G2E has the smallest area embodiments are not limited thereto.

The light receiving areas RA of the detection elements may be between the light emitting areas RE, G1E, G2E, and BE of the sub pixels R, G1, G2, and B. The light receiving areas RA may be defined by a first bank 171, which is described in more detail below. The light receiving areas RA may be areas to receive light emitted from the light emitting areas RE, G1E, G2E, and BE and reflected or scattered from the fingerprint (e.g., from the finger) of the user.

The light receiving areas RA and the light emitting areas RE, G1E, G2E, and BE may be alternately arranged in a plan view. In the embodiment, as shown in FIG. 4, the light receiving areas RA may be between the light emitting areas RE, G1E, G2E, and BE. For example, in some embodiments, the light receiving areas RA may be between each of the first light emitting areas RE and each of the third light emitting areas BE and may also be between each of the second-A light emitting areas G1E and each of the second-B light emitting areas G2E. In some embodiments, the light emitting areas RE, G1E, G2E, and BE may be at one side and the other side of the light receiving areas RA (e.g., of each light receiving area RA).

Areas of the light receiving areas RA may be different from areas of the light emitting areas RE, G1E, G2E, and BE. In some embodiments, the areas of the light receiving areas RA may be greater than the areas of the light emitting areas RE, G1E, G2E, and BE. In some embodiments, the number of light receiving areas RA may be the same as the number of light emitting areas RE, G1E, G2E, and BE. However, embodiments of the present disclosure are not limited thereto. In some embodiments, the number of light receiving areas RA may be twice or more the number of light emitting areas RE, G1E, G2E, and BE.

Hereinafter, a cross-sectional structure of each of the detection elements and of the light emitting elements will be described in more detail.

Figure 5:
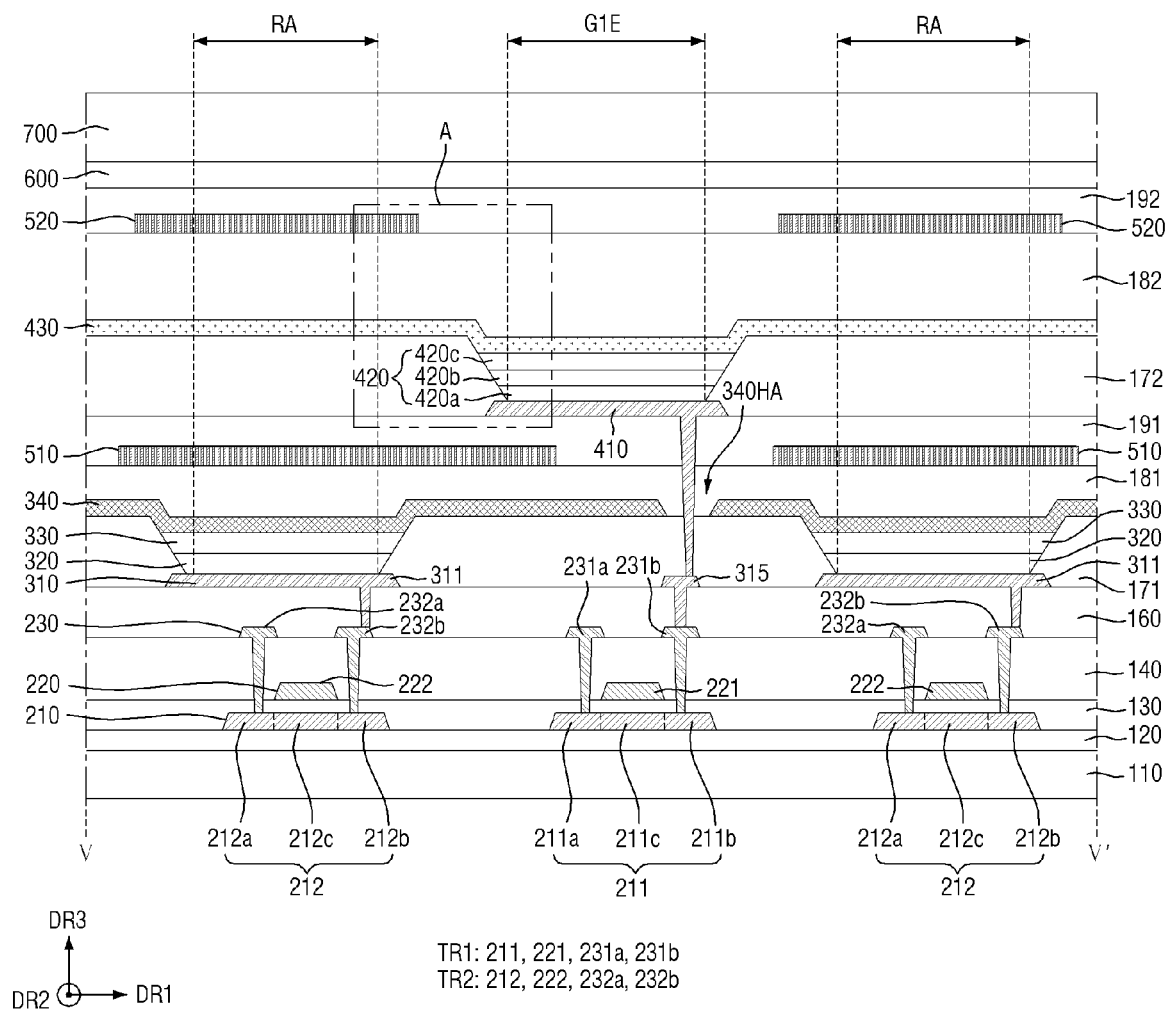
FIG. 5 is a cross-sectional view taken along line V-V' in FIG. 4, according to an embodiment.
Figure 6:
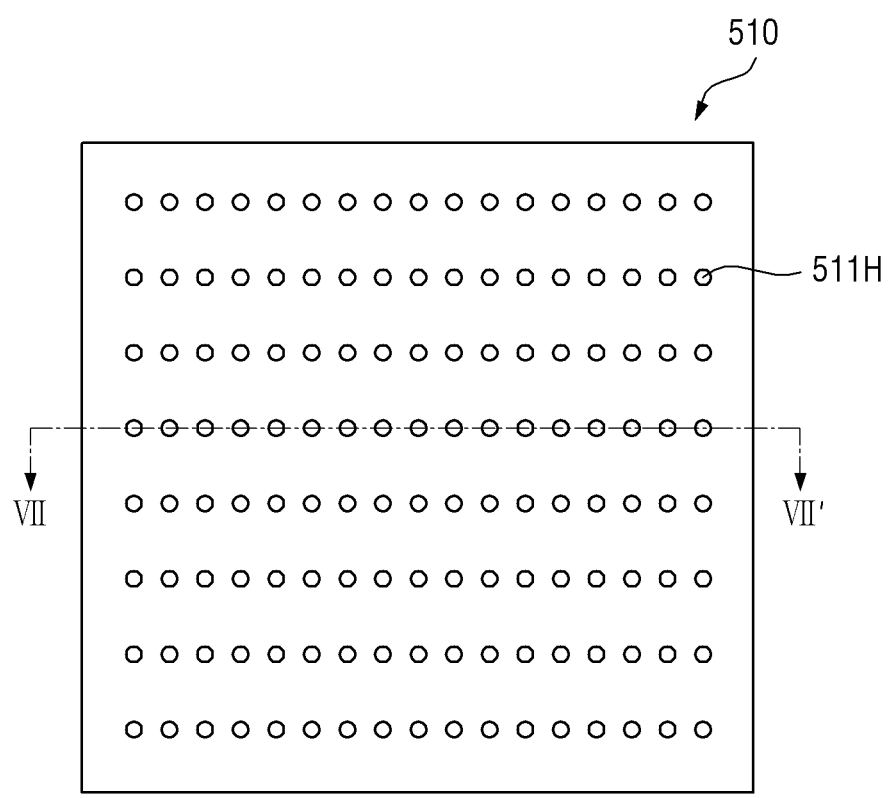
FIG. 6 is a plan view of a first optical system in FIG. 5, according to an embodiment.
Figure 7:
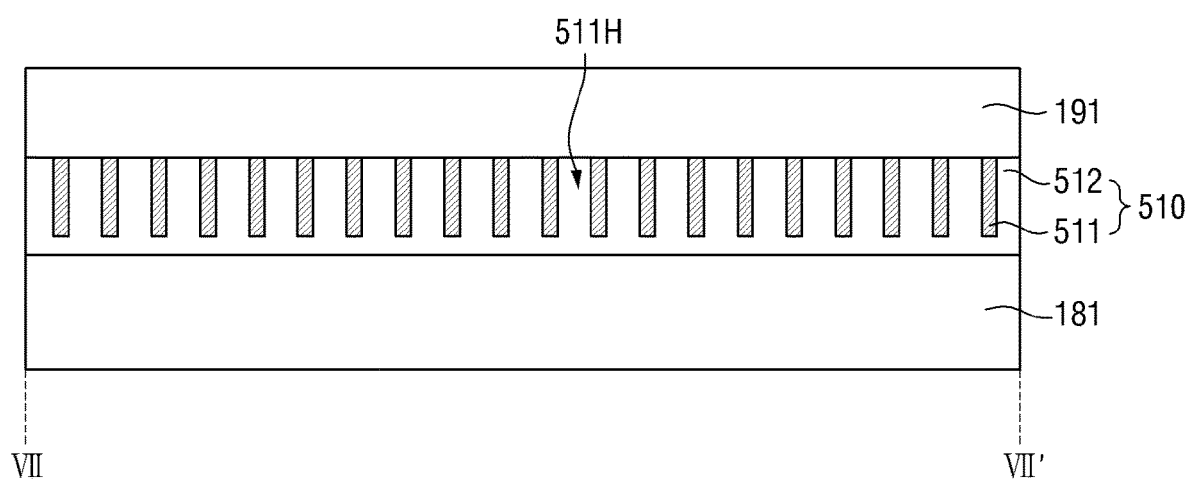
FIG. 7 is a cross-sectional view taken along line VII-VII' in FIG. 6, according to an embodiment.
Figure 8:
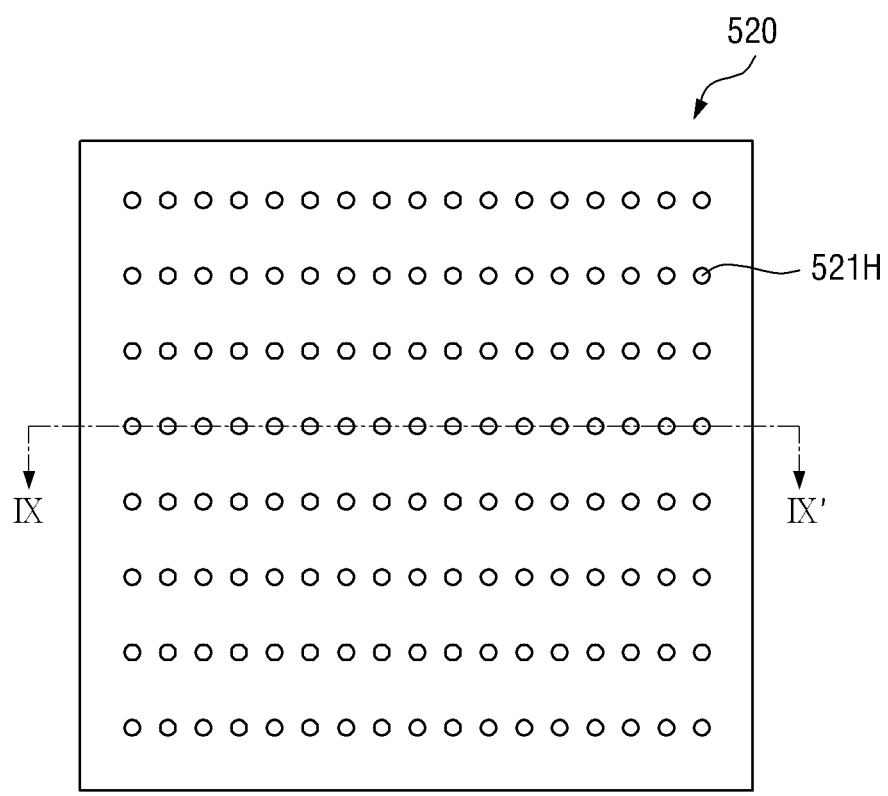
FIG. 8 is a plan view of a second optical system in FIG. 5, according to an embodiment.
Figure 9:
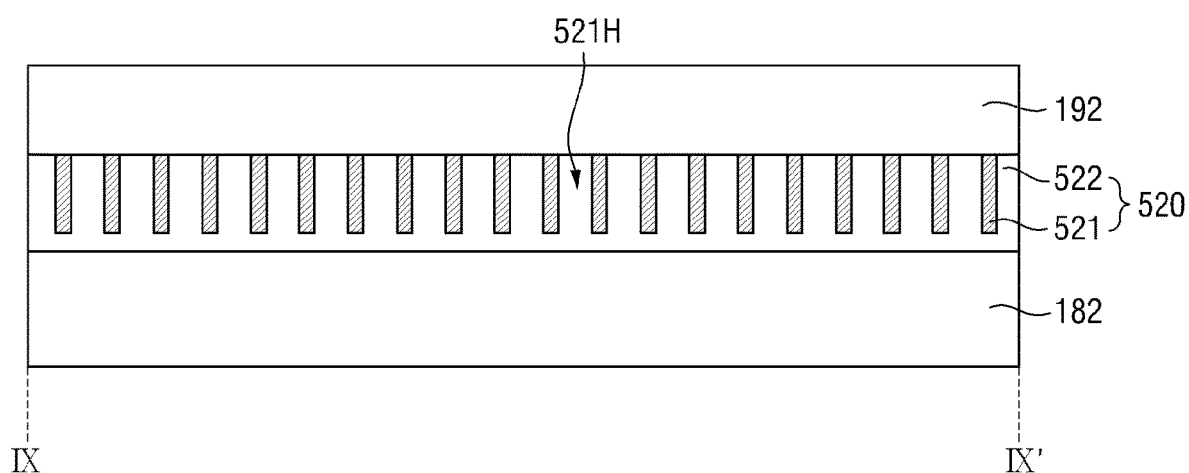
FIG. 9 is a cross-sectional view taken along line IX-IX' in FIG. 8, according to an embodiment.
Figure 10:
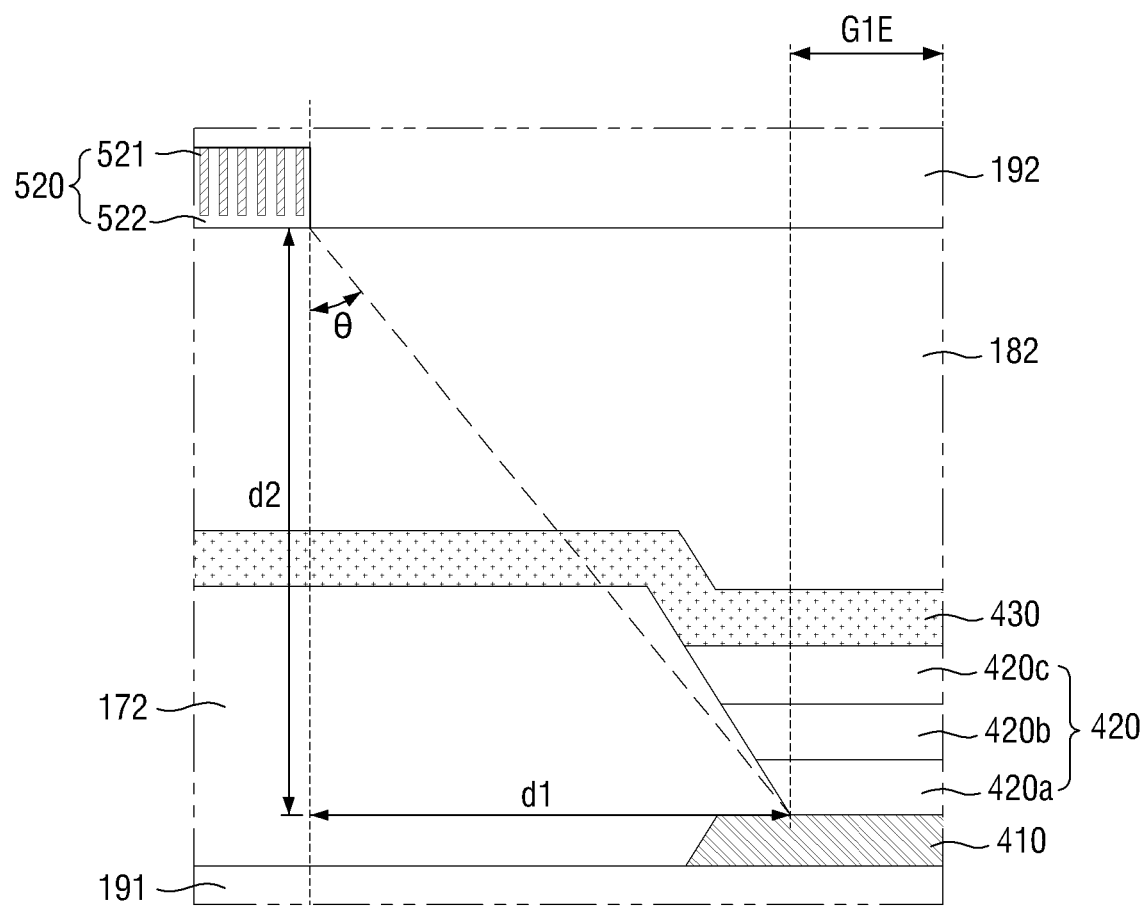
FIG. 10 is an enlarged cross-sectional view of area A in FIG. 5, according to an embodiment.
Figure 11:
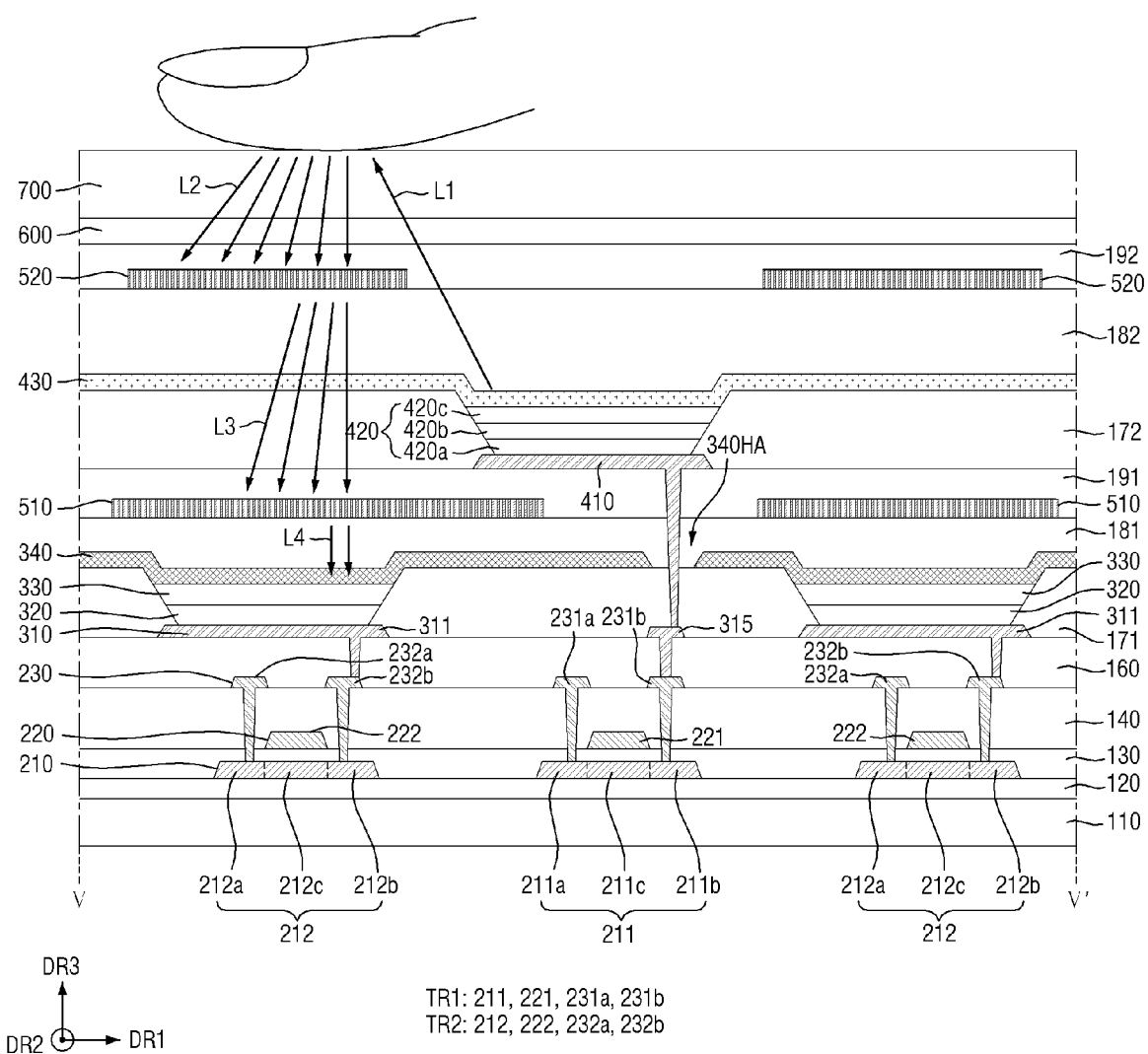
FIG. 11 is a cross-sectional view taken along line V-V' in FIG. 4, according to an embodiment, for describing a process of recognizing a fingerprint of a user.

FIG. 5 is a cross-sectional view taken along line V-V' in FIG. 4, according to an embodiment. FIG. 6 is a plan view of a first optical system in FIG. 5, according to an embodiment. FIG. 7 is a cross-sectional view taken along line VII-VII' in FIG. 6, according to an embodiment. FIG. 8 is a plan view of a second optical system in FIG. 5, according to an embodiment. FIG. 9 is a cross-sectional view taken along line IX-IX' in FIG. 8, according to an embodiment. FIG. 10 is an enlarged cross-sectional view of area A in FIG. 5, according to an embodiment. FIG. 11 is a cross-sectional view taken along line V-V' in FIG. 4, according to an embodiment, for describing a process of recognizing a fingerprint of a user.

Referring to FIG. 5, the display device 1 may include the substrate 110, a transistor TR1 for a light emitting element, a transistor TR2 for a detection element, detection elements 311, 320, 330, and 340, light emitting elements 410, 420, and 430, a first optical system 510, and a second optical system 520.

The substrate 110 may support layers thereon. The substrate 110 may include an insulation material. The substrate 110 may include an inorganic material such as, for example, glass, quartz, and/or the like, and/or may include an organic material such as, for example, polyimide and/or the like. The substrate 110 may be a rigid substrate or a flexible substrate.

A buffer layer 120 is on the substrate 110. The buffer layer 120 may prevent or reduce the diffusion of impurity ions, may prevent or reduce the permeation or penetration of moisture, and may perform (e.g., provide) a surface flattening function. The buffer layer 120 may include silicon nitride, silicon oxide, and/or silicon oxynitride.

A semiconductor layer 210 is on the buffer layer 120. The semiconductor layer 210 may include channels of a plurality of transistors. In some embodiments, the semiconductor layer 210 may include a first active layer 211 of the transistor TR1 for a light emitting element and a second active layer 212 of the transistor TR2 for a detection element.

The first active layer 211 may include a first source area 211a, a first drain area 211b, and a first channel area 211c. The first channel area 211c may be between the first source area 211a and the first drain area 211b. A first source electrode 231a and a first drain electrode 231b, which are described in more detail below, may be electrically connected to the first source area 211a and the first drain area 211b, respectively.

The second active layer 212 may include a second source area 212a, a second drain area 212b, and a second channel area 212c. The second channel area 212c may be between the second source area 212a and the second drain area 212b. A second source electrode 232a and a second drain electrode 232b, which are described in more detail below, may be electrically connected to the second source area 212a and the second drain area 212b, respectively.

The semiconductor layer 210 may include polycrystalline silicon. The polycrystalline silicon may be formed by crystallizing amorphous silicon. In some embodiments where the semiconductor layer 210 includes polycrystalline silicon, when ions are doped into the semiconductor layer 210, the ion-doped semiconductor layer 210 may have conductivity (e.g., electrical conductivity).

In some embodiments, the semiconductor layer 210 may include monocrystalline silicon, low temperature polycrystalline silicon, amorphous silicon, or an oxide semiconductor. The oxide semiconductor may include, for example, a binary (ABx) compound, a ternary compound (ABxCy), and/or a quaternary compound (ABxCyDz) including indium (In), zinc (Zn), gallium (Ga), tin (Sn), titanium (Ti), aluminum (Al), hafnium (Hf), zirconium (Zr), magnesium (Mg), and/or the like. In some embodiments, the semiconductor layer 210 may include ITZO (oxide including indium, tin, titanium) and/or IGZO (oxide including indium, gallium, tin).

A first insulation layer 130 is on the semiconductor layer 210. Generally, the first insulation layer 130 may be over (e.g., may be continuously over) an entire surface of the substrate 110. The first insulation layer 130 may be a gate insulation film having a gate insulation function. The first insulation layer 130 may include a silicon compound, a metal oxide, and/or the like. In some embodiments, the first insulation layer 130 may include silicon oxide, silicon nitride, silicon oxynitride, aluminum oxide, tantalum oxide, hafnium oxide, zirconium oxide, titanium oxide, and/or the like. The first insulation layer 130 may be a single film or a multilayer film including stacked films of different materials.

A first conductive layer 220 is on the first insulation layer 130. The first conductive layer 220 may include a first gate electrode 221 of the transistor TR1 for a light emitting element and a second gate electrode 222 of the transistor TR2 for a detection element.

The first gate electrode 221 may overlap the first channel area 211c. Further, the second gate electrode 222 may overlap the second channel area 212c.

The first conductive layer 220 may include one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 220 may be a single film or a multilayer film.

A second insulation layer 140 may be on the first conductive layer 220. The second insulation layer 140 may be over (e.g., may be continuously over) the entire surface of the substrate 110. The second insulation layer 140 may insulate the first conductive layer 220 and a second conductive layer 230 (e.g., may insulate the first conductive layer 220 from a second conductive layer 230). The second insulation layer 140 may be an interlayer insulation film. The second insulation layer 140 may include the same materials as first insulation layer 130, or may include one or more materials selected from the group of materials that may be included in the first insulation layer 130, as described above.

The second conductive layer 230 may be on the second insulation layer 140. The second conductive layer 230 may include the first source electrode 231a and the first drain electrode 231b of the transistor TR1 for a light emitting element, and the second source electrode 232a and the second drain electrode 232b of the transistor TR2 for a detection element.

The first source electrode 231a may contact the first source area 211a through a contact hole that exposes the first source area 211a through the second insulation layer 140. Further, the first drain electrode 231b may contact the first drain area 211b through a contact hole that exposes the first drain area 211b through the second insulation layer 140.

The second source electrode 232a may contact the second source area 212a through a contact hole that exposes the second source area 212a through the second insulation layer 140. Further, the second drain electrode 232b may contact the second drain area 212b through a contact hole that exposes the second drain area 212b through the second insulation layer 140.

The second conductive layer 230 may include one or more metals selected from among aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), germanium (Ge), and copper (Cu). The second conductive layer 230 may be a single film or a multilayer film. For example, the second conductive layer 230 may include a stacked structure of Ti/Al/Ti, Mo/Al/Mo, Mo/AlGe/Mo, Ti/Cu, and/or the like.

A third insulation layer 160 may be on the second conductive layer 230. The third insulation layer 160 may be a via layer. The third insulation layer 160 may include an organic insulation material such as, for example, a polyacrylate resin, an epoxy resin, a phenolic resin, a polyamide resin, a polyimide resin, an unsaturated polyester resin, a polyphenylene ether resin, a polyphenylene sulfide resin, benzocyclobutene (BCB), and/or the like.

A fourth conductive layer 310 may be on the third insulation layer 160. The fourth conductive layer 310 may include a connection electrode 315 of the transistor TR1 for a light emitting element and a first detection electrode 311 of the transistor TR2 for a detection element.

The connection electrode 315 may be connected to the first drain electrode 231b through a contact hole that exposes the first drain electrode 231b through the third insulation layer 160. Although FIG. 5 illustrates an embodiment where the connection electrode 315 is connected to the first drain electrode 231b, embodiments of the present disclosure are not limited thereto. For example, in some embodiments, the connection electrode 315 may be connected to the first source electrode 231a through a contact hole that exposes the first source electrode 231a through the third insulation layer 160.

The connection electrode 315 may connect a first electrode 410 of the light emitting elements 410, 420, and 430, which are described in more detail below, and (e.g., to) the first source electrode 231a or the first drain electrode 231b of the transistor TR1 for a light emitting element.

The first detection electrode 311 may be connected to the second drain electrode 232b through a contact hole that exposes the second drain electrode 232b through the third insulation layer 160. Although FIG. 5 illustrates an embodiment where the first detection electrode 311 is connected to the second drain electrode 232b, embodiments of the present disclosure are not limited thereto. For example, in some embodiments, the first detection electrode 311 may be connected to the second source electrode 232a through a contact hole that exposes the second source electrode 232a through the third insulation layer 160.

The fourth conductive layer 310 including the first detection electrode 311 may include a reflective electrode so that light incident on the detection elements 311, 320, 330, and 340 is transmitted and not lost. In some embodiments, the fourth conductive layer 310 may include a metallic material having high reflectivity such as, for example, a stacked structure of aluminum and titanium (Ti/Al/Ti), a stacked structure of aluminum and ITO (ITO/Al/ITO), an APC alloy, and/or a stacked structure of the APC alloy and ITO (ITO/APC/ITO). The APC alloy is an alloy of silver (Ag), palladium (Pd), and copper (Cu).

The first bank 171 may be on the fourth conductive layer 310. The first bank 171 may include an opening that exposes the first detection electrode 311. The opening may define a detection area RA of the detection elements 311, 320, 330, and 340.

The first bank 171 may include an inorganic insulation material such as, for example, silicon oxide, silicon nitride, silicon oxynitride, hafnium oxide, aluminum oxide, titanium oxide, tantalum oxide, zinc oxide, and/or the like, and/or may include an organic insulation material such as, for example, a polyacrylate resin, an epoxy resin, a phenolic resin, a polyamide resin, a polyimide resin, an unsaturated polyester resin, a polyphenylene ether resin, a polyphenylene sulfide resin, benzocyclobutene (BCB), and/or the like. The first bank 171 may be a single film or a multilayer film including stacked films of different materials.

A photosensitive layer 330 is in the opening of the first bank 171. The photosensitive layer 330 may absorb and detect light reflected or scattered from the fingerprint (e.g., from the finger) of the user. In some embodiments, a difference between an amount of the light reflected or scattered from the ridges and from the valleys of the fingerprint of the user (and absorbed in the photosensitive layer 330) may be sensed, and the fingerprint may be recognized by utilizing the sensed difference. Holes and electrons generated when the photosensitive layer 330 absorbs light may be transferred to (e.g., may move to) the first detection electrode 311 and a second detection electrode 340, respectively.

The photosensitive layer 330 may include an organic photosensitive material. For example, the organic photosensitive material may include a dithiolene-based material (BDN) (bis (4-dimethylaminodithiobenzyl) nickel (II)), a benzotriazole-based polymer compound (PTZBTTT-BDT), a porphyrin-based small molecule material (DHTBTEZP), and/or the like, but embodiments are not limited thereto.

An electron blocking layer 320 may be between the photosensitive layer 330 and the first detection electrode 311. The electron blocking layer 320 may block the electrons generated in the photosensitive layer 330 from moving to the first detection electrode 311.

The second detection electrode 340 may be on the photosensitive layer 330. The second detection electrode 340 may include a transparent electrode to increase or maximize the transmission of light incident on the detection elements 311, 320, 330, and 340. For example, the second detection electrode 340 may include a material layer including lithium (Li), calcium (Ca), LiF/Ca, LiF/Al, aluminum (Al), magnesium (Mg), silver (Ag), platinum (Pt), palladium (Pd), nickel (Ni), gold (Au), neodymium (Nd), iridium (Ir), chromium (Cr), barium fluoride (BaF), barium (Ba), a compound or a mixture thereof (e.g., a mixture of Ag and Mg, or the like), and/or the like. The second detection electrode 340 may further include a transparent metal oxide layer on the material layer.

The second detection electrode 340 may include a hole area 340HA. The hole area 340HA of the second detection electrode 340 may pass through the second detection electrode 340 in the third direction DR3 (e.g., in the thickness direction) to provide an opening. The hole area 340HA of the second detection electrode 340 may partially expose one surface (e.g., the upper surface) of the first bank 171 under the second detection electrode 340.

The hole area 340HA of the second detection electrode 340 may at least partially overlap the first electrode 410, which is described in more detail below. Accordingly, the first electrode 410 may contact the connection electrode 315 thereunder through a contact hole in the hole area 340HA.

The first detection electrode 311, the electron blocking layer 320, the photosensitive layer 330, and the second detection electrode 340, which are described above, may form (e.g., may constitute) the detection elements.

The first thin film encapsulation film 181 may be on the second detection electrode 340. Because the first thin film encapsulation film 181 is described with reference to FIG. 3, redundant descriptions thereof will not be repeated.

The first optical system 510 may be on the first thin film encapsulation film 181. One surface (e.g., a lower surface) of the first optical system 510 may directly contact one surface (e.g., an upper surface) of the first thin film encapsulation film 181.

The first optical system 510 may remove or reduce noise by selectively transmitting light to be detected from among the light provided to the first optical system 510. Accordingly, a signal to noise ratio (SNR) of a fingerprint recognition signal of the display device 1 may be improved.

Therefore, the first optical system 510 may overlap the detection elements 311, 320, 330, and 340 in the thickness direction.

The first optical system 510 will be described with reference to FIGS. 6 and 7. For convenience of description, in FIG. 7, the first thin film encapsulation film 181 and a first passivation film 191 respectively on one surface (e.g., the lower surface) and the other surface (e.g., an upper surface) of the first optical system 510 are shown together.

Referring to FIGS. 6 and 7, the first optical system 510 may include a first optical layer 511 and a first filling layer 512.

The first optical layer 511 may be between the first thin film encapsulation film 181 and the first passivation film 191, which is described in more detail below. The first optical layer 511 may include a plurality of through holes 511H. The through holes 511H may pass through the first optical layer 511 in the third direction DR3 (e.g., in the thickness direction) to partially expose the first passivation film 191.

The through holes 511H may selectively transmit light to be detected from among the light provided to the first optical layer 511. In some embodiments, the light to be detected from among the light provided to the first optical layer 511 may be transmitted by the through holes 511H of the first optical layer 511, and the transmitted light may be provided to the detection elements 311, 320, 330, and 340. The light provided to the first optical layer 511, other than the light to be detected, may be blocked by the first optical layer 511. Accordingly, because noise may be removed when the detection elements 311, 320, 330, and 340 receive the light, a signal to noise ratio (SNR) of a fingerprint recognition signal may be improved. The first optical layer 511 may include a metallic material. Further, the first optical layer 511 may include a black organic pigment.

The through holes 511H of the first optical layer 511 may be spaced apart from each other in the first direction DR1 and in the second direction DR2, which is orthogonal to the first direction DR1 in a plan view. The through holes 511H may be arranged in a plurality of matrix or substantially matrix shapes. The through holes 511H may have a circular shape in a plan view. However, embodiments of the present disclosure are not limited thereto, and the through holes 511H may have any suitable shape, such as, for example, an elliptical shape or a polygonal shape. In some embodiments where the through holes 511H have an octagonal shape, the noise removal effect may be maximized or improved.

The first filling layer 512 may be between the first optical layer 511 and the first thin film encapsulation film 181. The first filling layer 512 may fill the plurality of through holes 511H of the first optical layer 511. In some embodiments, the first filling layer 512 may contact inner sidewalls of the through holes 511H. Further, the first filling layer 512 may contact the first passivation film 191 exposed by the through holes 511H of the first optical layer 511. The first filling layer 512 may include a transparent organic material. For example, the first filling layer 512 may include a polymer resin such as, for example, polyimide, polyurethane, polycarbonate, polypropylene, polyethylene, and/or the like.

Referring to FIG. 5 again, the first passivation film 191 may be on the first optical system 510. The first passivation film 191 may prevent or reduce the permeation or penetration of oxygen and/or moisture into the detection elements 311, 320, 330, and 340. The first passivation film 191 may include at least one inorganic film and/or organic film. The inorganic film may include, for example, one or more inorganic materials selected from among AlxOy, TiOx, ZrOx, SiOx, AlOxNy, AlxNy, SiOxNy, SixNy, ZnOx, and TaxOy. The organic film may be formed by polymerization of at least one monomer selected from, for example, the group consisting of pentabromophenyl acrylate, 2-(9H-Carbazol-9-yl) ethyl methacrylate, N-vinylcarbazole, bis (methacryloylthiophenyl) sulfide, and zirconium acrylate. The organic film may be a planarization film.

Light emitting elements including the first electrode 410, a light emitting layer 420, and a second electrode 430 may be on the first passivation film 191.

The first electrode 410 may be on the first passivation film 191. The first electrode 410 may contact the above-described connection electrode 315 through a contact hole passing through the first passivation film 191, the first thin film encapsulation film 181, and the first bank 171. In some embodiments, the first electrode 410 may be electrically connected to the first source electrode 231a or the first drain electrode 231b by the connection electrode 315.

The light emitting elements 410, 420, and 430 may be formed in a top emission manner (e.g., a top emission structure or arrangement) in which light is emitted in an upward direction (e.g., in the third direction DR3 or towards the cover window 700). In some embodiments, the first electrode 410 may include a metallic material having high reflectivity such as, for example, a stacked structure of aluminum and titanium (Ti/Al/Ti), a stacked structure of aluminum and ITO (ITO/Al/ITO), an APC alloy, and/or a stacked structure of the APC alloy and ITO (ITO/APC/ITO). In some embodiments, the first electrode 410 may include the same material as the above-described first detection electrode 311, but embodiments are not limited thereto.

The second bank 172 may be on the first electrode 410. The second bank 172 may include an opening that exposes the first electrode 410. The opening may define the light emitting areas RE, G1E, G2E, and BE of the sub pixels R, G1, G2, and B. For convenience of description, in FIG. 5, only the light emitting area G1E of the second-A sub pixel G1 is illustrated from among the light emitting areas RE, G1E, G2E, and BE of the sub pixels R, G1, G2, and B.

The second bank 172 may include an inorganic insulation material such as, for example, silicon oxide, silicon nitride, silicon oxynitride, hafnium oxide, aluminum oxide, titanium oxide, tantalum oxide, zinc oxide, and/or the like, and/or an organic insulation material such as, for example, a polyacrylate resin, an epoxy resin, a phenolic resin, a polyamide resin, a polyimide resin, an unsaturated polyester resin, a polyphenylene ether resin, a polyphenylene sulfide resin, benzocyclobutene (BCB), and/or the like. Further, the second bank 172 may include the same material as the above-described first bank 171, but embodiments are not limited thereto.

The light emitting layer 420 is in the opening of the second bank 172. The light emitting layer 420 may have a structure in which a plurality of layers is stacked. In some embodiments, the light emitting layer 420 may include a hole transporting layer 420a, a light emitting material layer 420b, and an electron transporting layer 420c. The hole transporting layer 420a may be on the first electrode 410, the electron transporting layer 420c may be on the hole transporting layer 420a, and the light emitting material layer 420b may be between the hole transporting layer 420a and the electron transporting layer 420c.

The second electrode 430 may be on the light emitting layer 420 and on the second bank 172. The second electrode 430 may be on (e.g., may be continuously on) the substrate 110. The second electrode 430 may include a material layer having a small work function such as, for example, lithium (Li), calcium (Ca), LiF/Ca, LiF/Al, aluminum (Al), magnesium (Mg), silver (Ag), platinum (Pt), palladium (Pd), nickel (Ni), gold (Au), neodymium (Nd), iridium (Ir), chromium (Cr), barium fluoride (BaF), barium (Ba), a compound or a mixture thereof (e.g., a mixture of Ag and Mg, or the like), and/or the like. The second electrode 430 may further include a transparent metal oxide layer on the material layer having a small work function. Further, the second electrode 430 may include the same material as the above-described second detection electrode 340, but embodiments are not limited thereto.

The second thin film encapsulation film 182 may be on the second electrode 430. Because the second thin film encapsulation film 182 is described with reference to FIG. 3, redundant descriptions thereof will not be repeated.

The second optical system 520 may be on the second thin film encapsulation film 182. One surface (e.g., a lower surface) of the second optical system 520 may directly contact one surface (e.g., an upper surface) of the second thin film encapsulation film 182.

The second optical system 520 may remove noise by selectively transmitting light to be detected from among the light reflected or scattered from the fingerprint (e.g., from the finger) and received by the second optical system 520. Accordingly, a signal to noise ratio (SNR) of a fingerprint recognition signal of the display device 1 may be improved. Therefore, the second optical system 520 may overlap the photosensitive layer 330.

Further, the second optical system 520 may overlap the first optical system 510. In some embodiments, because the light from which noise is primarily removed (e.g., is first partially removed) by the second optical system 520 may be provided to the first optical system 510, and noise may be secondarily removed (e.g., may be further removed) by the first optical system 510, a signal to noise ratio (SNR) may be more effectively improved.

The second optical system 520 will be described in more detail with reference to FIGS. 8 and 9. For convenience of description, in FIG. 9, the second thin film encapsulation film 182 and a second passivation film 192 respectively on one surface (e.g., a lower surface) and the other surface (e.g., an upper surface) of the second optical system 520 are shown together.

Referring to FIGS. 8 and 9, the second optical system 520 may include a second optical layer 521 and a second filling layer 522.

The second optical layer 521 may be between the second thin film encapsulation film 182 and the second passivation film 192, which is described herein below. The second optical layer 521 may include a plurality of through holes 521H. The through holes 521H may pass through the second optical layer 521 in the third direction DR3 (e.g., in the thickness direction) to partially expose the second passivation film 192.

The through holes 521H may selectively transmit light to be detected from among the light reflected or scattered from the fingerprint (e.g., from the finger) and received by the second optical system 520. In some embodiments, the light to be detected from among the light reflected or scattered from the fingerprint (e.g., from the finger) and received by the second optical system 520 may be transmitted by the through holes 521H of the second optical layer 521, and the transmitted light may be provided to the detection elements 311, 320, 330, and 340. The light reflected or scattered from the fingerprint (e.g., from the finger) and received by the second optical system 520, other than the light to be detected, may be blocked by the second optical layer 521. Accordingly, because noise may be removed when (e.g., before) the detection elements 311, 320, 330, and 340 receive the light, a signal to noise ratio (SNR) of a fingerprint recognition signal may be improved, as described above.

The second optical system 520 may be spaced apart from the light emitting areas RE, G1E, G2E, and BE by predetermined or set distances. The disposition (e.g., the location or placement) of the second optical system 520 will be described with reference to FIG. 10. For convenience of description, in FIG. 10, only the second-A light emitting area G1E of the second-A sub pixel G1 is shown from among the light emitting areas RE, G1E, G2E, and BE of the sub pixels R, G1, G2, and B.

Referring to FIG. 10, the second optical system 520 may be spaced apart from the second-A light emitting area G1E in a horizontal direction. In some embodiments, the second-A light emitting area G1E may be defined as an area in which the light emitting layer 420 comes into contact with the first electrode 410 exposed by the opening of the second bank 172.

A first length d1 in which the second optical system 520 is spaced apart from the second-A light emitting area G1E in the horizontal direction may be smaller than a second length d2, which is a vertical distance from an upper surface of the first electrode 410 to a lower surface of the second optical system 520. In some embodiments, the upper surface of the first electrode 410 may be a surface at which the first electrode 410 contacts the light emitting layer 420. Further, the lower surface of the second optical system 520 may be a surface at which the second optical system 520 contacts the second thin film encapsulation film 182.

The first length d1 may vary according to the second length d2 and according to a first angle θ between a straight line, which connects an edge of the second-A light emitting area G1E and an edge of the lower surface of the second optical system 520, and the third direction DR3. The first length d1, the second length d2, and the first angle θ satisfy the following Equation 1.

$$d1 = \tan\theta * d2 \qquad \text{[Equation 1]}$$

The first angle θ may be adjusted in consideration of (e.g., may be determined by or may depend on) a light emitting angle of the light emitting element, an effective angle at which light is emitted to the outside of the display device to be recognized by the user, and the like. In some embodiments, the first angle θ may be about 14° to about 20°. For example, in some embodiments, the first angle θ may be about 17°, but embodiments are not limited thereto.

In addition, because a description of the second optical layer 521 may the same or substantially the same or similar to the description of the first optical layer 511, with reference to FIGS. 6 and 7, redundant descriptions thereof will not be repeated.

The second filling layer 522 may be between the second optical layer 521 and the second thin film encapsulation film 182. The second filling layer 522 may fill the plurality of through holes 521H of the second optical layer 521. In some embodiments, the second filling layer 522 may directly contact inner sidewalls of the through holes 521H. Further, the second filling layer 522 may contact the second passivation film 192 exposed by the through holes 521H of the second optical layer 521.

In addition, because a description of the second filling layer 522 is the same or substantially the same as or similar to the description of the first filling layer 512, with reference to FIGS. 6 and 7, redundant descriptions thereof will not be repeated.

Referring to FIG. 5 again, the second passivation film 192 may be on the second optical system 520. The second passivation film 192 may prevent or reduce the permeation or penetration of oxygen and/or moisture into the light emitting elements 410, 420, and 430. The second passivation film 192 may include the same materials as the first passivation film 191, or may include one or more materials selected from the group of materials that may be included in the first passivation film 191, as described above.

The sensing layer 600 may be on the second passivation film 192. Because the sensing layer 600 is described with reference to FIG. 3, redundant descriptions thereof will not be repeated.

The cover window 700 may be on the sensing layer 600. The cover window 700 may cover and protect the display panel 10.

The cover window 700 may include a transparent material. The cover window 700 may include, for example, glass and/or plastic. When the cover window 700 includes plastic, the cover window 700 may be flexible.

Examples of the plastic that may be included in the cover window 700 include polyimide, polyacrylate, polymethylmethacrylate (PMMA), polycarbonate (PC), polyethylene naphthalate (PEN), polyvinylidene chloride, polyvinylidene difluoride (PVDF), polystyrene, an ethylene-vinyl alcohol copolymer, polyethersulfone (PES), polyetherimide (PEI), polyphenylene sulfide (PPS), polyallylate, tri-acetyl cellulose (TAC), cellulose acetate propionate (CAP), and the like. The cover window 700 may include a plastic window that may include one or more of the plastic materials listed above. When the cover window 700 includes plastic, coating layers on an upper surface and a lower surface of the plastic may be further included. In some embodiments, the coating layer may be an organic layer including an acrylate compound and/or a hard coating layer including an organic-inorganic composite layer.

The cover window 700 and the display panel 10 may be coupled to each other by an adhesion member. The adhesion member may be an optically clear (e.g., transparent) adhesive film (OCA) or an optically clear (e.g., transparent) resin (OCR).

Hereinafter, a process of recognizing the fingerprint of the user is described with reference to FIG. 11.

An object that is to be biometrically recognized, for example, a finger of the user is placed on the cover window 700 of the display device 1, and light L1 is emitted from the light emitting elements 410, 420, and 430 (e.g., from the light emitting material layer 420b). The light L1 emitted from the light emitting elements 410, 420, and 430 (e.g., from the light emitting material layer 420b) may be emitted to (e.g., may travel to) a fingerprint portion of the user's finger to be reflected or scattered from a fingerprint surface of the user's finger.

Light L2 reflected or scattered from the fingerprint (e.g., from the finger) of the user may enter the cover window 700 and may be provided to the second optical system 520. As described above, the second optical system 520 may primarily remove noise by selectively transmitting light to be detected from among the light L2 reflected or scattered from the fingerprint (e.g., from the finger) of the user and received by the second optical system 520.

Light L3, which passes through the second optical system 520, may pass through (e.g., may sequentially pass through) the second thin film encapsulation film 182, the second electrode 430, the second bank 172, and the first passivation film 191, and may be provided to the first optical system 510. As described above, the first optical system 510 may secondarily remove noise by selectively transmitting light to be detected from among the light L3, which is provided to the second optical system 520.

Light L4, which passes through the first optical system 510, may be provided to the detection elements 311, 320, 330, and 340 by passing through the first thin film encapsulation film 181. In some embodiments, the light L4, which passes through the first optical system 510, may be received by the photosensitive layer 330 to be detected. Holes generated by the photosensitive layer 330 may be transferred to the first detection electrode 311, and fingerprint recognition may be performed by the transistor TR2 for a detection element.

As described above, the display device 1 may recognize biometric information of the user using (e.g., by utilizing) the light emitting elements 410, 420, and 430 of the pixel PX. In some embodiments, because an additional light source for biometric recognition is unnecessary, a process of forming the above (e.g., a process of forming an additional light source) may be omitted to secure process economics (e.g., to reduce manufacturing costs). Further, the mixing of colors of the pixel PX and a light amount decrease due to the additional light source may be prevented, reduced, or minimized to improve display quality of the display device 1.

Further, the first optical system 510 and the second optical system 520 may remove noise by selectively transmitting light to be detected from among the received light. In some embodiments, because the light from which noise is primarily removed by the second optical system 520 may be provided to the first optical system 510, and noise may be secondarily removed by the first optical system 510, the signal to noise ratio (SNR) may be improved.

A display device, according to some embodiments, can recognize biometric information of a user by using (e.g., by utilizing) a light emitting element of a pixel. In some embodiments, because an additional light source for biometric recognition is unnecessary, a process of forming the additional light source can be omitted to secure process economics (e.g., to reduce manufacturing costs). Further, the mixing of colors of the pixel and a light amount decrease due to the additional light source can be prevented, reduced or minimized to improve display quality of the display device.

Further, because a first optical system and a second optical system are on a detection element, noise received by the detection element during light reception can be removed or reduced to improve a signal to noise ratio (SNR).

Aspects and effects, according to some embodiments of the present disclosure, are not limited to the above, and other aspects and effects are included in the specification.

In concluding the detailed description, those of ordinary skill in the art will appreciate that many variations and modifications can be made to the disclosed embodiments without substantially departing from the principles of the present disclosure. Therefore, the disclosed embodiments of the present disclosure are used in a generic and descriptive sense only, and not for purposes of limitation.

What is claimed is:
1. A display device comprising:
a first substrate;
a thin film transistor layer disposed on a first surface of the first substrate;
a detection element layer disposed on the thin film transistor layer, the detection element layer configured to detect a light;
a light emitting element layer disposed on the detection element layer;
a first optical system disposed between the detection element layer and the light emitting element layer;
a touch sensing layer disposed on the light emitting element layer; and
a second optical system disposed between the light emitting element layer and the touch sensing layer.

2. The display device of claim 1,
wherein the light emitting element layer comprises a light emitting element,
wherein the detection element layer comprises a detection element, and
wherein the thin film transistor layer comprises a first thin film transistor connected to the detection element and a second thin film transistor connected to the light emitting element.

3. The display device of claim 2,
wherein the second optical system does not overlap a light emitting layer of the light emitting element in a direction perpendicular to the first surface of the first substrate.

4. The display device of claim 2,
wherein the second optical system overlaps the detection element in a direction perpendicular to the first surface of the first substrate.

5. The display device of claim 4,
wherein the first optical system overlaps the detection element and the second optical system in the direction perpendicular to the first surface of the first substrate.

6. The display device of claim 2,
wherein the detection element comprises:
a first detection electrode on the first substrate,
a photosensitive layer on the first detection electrode, and
a second detection electrode on the photosensitive layer; and
wherein the first optical system and the second optical system overlap the photosensitive layer in a direction perpendicular to the first surface of the first substrate.

7. The display device of claim 6, wherein a width of the first optical system in a first direction is greater than a width of the photosensitive layer in the first direction.

8. The display device of claim 6, wherein:
the second detection electrode includes a hole area which passes through the second detection electrode in the direction perpendicular to the first surface of the first substrate; and
wherein the hole area overlaps the first detection electrode.

9. The display device of claim 1, wherein the first optical system includes a first optical layer including a plurality of through holes and a first filling layer which fills the through holes of the first optical layer.

10. The display device of claim 9, wherein:
the first optical layer includes a metallic material; and
the first filling layer includes a transparent organic material.

11. The display device of claim 9, wherein the second optical system includes a second optical layer including a plurality of through holes and a second filling layer which fills the through holes of the second optical layer.

12. The display device of claim 11, wherein:
the second optical layer includes the same material as the first optical layer; and
the second filling layer includes the same material as the first filling layer.

13. The display device of claim 1, further comprising a first insulation layer between the detection element layer and the first optical system,
wherein the first optical system contacts the first insulation layer.

14. The display device of claim 1, further comprising a second insulation layer between the light element layer and the second optical system,
wherein the second optical system contacts the second insulation layer.

15. A display device comprising:
a first substrate;
a first detection electrode on a first surface of the first substrate;
a photosensitive layer on the first detection electrode;
a second detection electrode on the photosensitive layer;
a first electrode on the second detection electrode;
a light emitting layer on the first electrode;
a second electrode on the light emitting layer;
a first optical system between the second detection electrode and the first electrode; and
a second optical system on the second electrode,
wherein the second optical system overlaps the photosensitive layer in a first direction perpendicular to the first surface of the first substrate.

16. The display device of claim 15, wherein the photosensitive layer does not overlap the light emitting layer in the first direction.

17. The display device of claim 16, wherein the first optical system overlaps the second optical system in the first direction.

18. The display device of claim 17, wherein the first optical system overlaps the light emitting layer in the first direction.

19. The display device of claim 15, wherein the second detection electrode overlaps the light emitting layer in the first direction.

20. The display device of claim 15, further comprising:
an insulation layer disposed between the first surface of the first substrate and the first detection electrode;
a first thin film transistor and a second thin film transistor disposed between the first surface of the first substrate and the insulation layer,
wherein the first detection electrode is connected to the first thin film transistor, and
wherein the first electrode is connected to the second thin film transistor.

* * * * *